(12) United States Patent
Kamizono et al.

(10) Patent No.: US 6,407,795 B1
(45) Date of Patent: Jun. 18, 2002

(54) LIQUID CRYSTAL DISPLAY AND ITS INSPECTING METHOD

(75) Inventors: Toshihiko Kamizono, Kagoshima; Hiroshi Kinoshita; Tsuyoshi Ishigame, both of Ishikawa, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/914,919

(22) PCT Filed: Mar. 7, 2000

(86) PCT No.: PCT/JP00/01362

§ 371 (c)(1),
(2), (4) Date: Nov. 19, 2001

(87) PCT Pub. No.: WO00/54098

PCT Pub. Date: Sep. 14, 2000

(30) Foreign Application Priority Data

Mar. 8, 1998 (JP) ............................................. 11-060064

(51) Int. Cl.$^7$ ............................................. G02F 1/1333
(52) U.S. Cl. ..................... 349/149; 349/150; 349/151; 349/152
(58) Field of Search ................. 349/149, 150, 349/151, 152

(56) References Cited

U.S. PATENT DOCUMENTS 6,198,519 B1 * 3/2001 Chang ........................ 349/129
6,266,119 B1 * 7/2001 Takahashi et al. .......... 349/149

FOREIGN PATENT DOCUMENTS

| JP | 62-10622 | 1/1987 |
| JP | 62-36571 | 3/1987 |
| JP | 4-79333 | 7/1992 |
| JP | 5-29030 | 4/1993 |
| JP | 5-241178 | 9/1993 |
| JP | 6-59269 | 3/1994 |
| JP | 8-36189 | 2/1996 |
| JP | 10-74550 | 3/1998 |
| JP | 10-96949 | 4/1998 |

* cited by examiner

Primary Examiner—James Dudek
(74) Attorney, Agent, or Firm—Wenderoth, Lind & Ponack, L.L.P.

(57) ABSTRACT

A liquid crystal panel (1) includes plural signal lines and scanning lines disposed in matrix, and liquid-crystal-driving LSIs (5, 6) having input and output portions directly connected by thermocompression bonding with an anisotropically conductive adhesive (9). The LSIs are mounted on a conductor on a rim of the panel. Film jumper boards (10, 14), the respective numbers of which correspond to the number of the driving LSIs (5, 6), connects between a terminal conductor (21) at the rim of the liquid crystal panel (1) and circuit boards (12, 16). As a result, a liquid crystal display which can be designed freely, can be modified easily, can employs common components, and can have a defective driving LSI specified and repaired readily and accurately is provided. A method of inspecting the display is also provided.

13 Claims, 16 Drawing Sheets

PRIOR ART

PRIOR ART

LIQUID CRYSTAL DISPLAY AND ITS INSPECTING METHOD

TECHNICAL FIELD

The present invention relates to a liquid crystal display for a video monitor such as a television receiver or a display of a computer system, and particularly to a method of fabricating and inspecting the display.

BACKGROUND ART

As liquid crystal displays have recently been improved in a low-voltage operation, low power consumption, and thickness, the displays are widely used as AV devices, OA devices, or house-hold appliances as well as television receivers or monitors. Also, they have an increased screen size.

In such a liquid crystal display, a liquid crystal driving LSI is commonly mounted as a semiconductor chip by a mounting method selected from various techniques. As the method, a tape automated bonding (TAB) method and a chip on glass (COG) method are known.

In the TAB method (also called a TAB mounting), a film circuit board (referred to as a tape carrier package or TCP) on which a driving LSI chip is mounted has an output port connected to a liquid crystal panel and an input port connected to an external circuit board. Although the TAB method is often used for a liquid crystal display, an overall size (outline) of the display may significantly increase.

In the COG method (also called a COG mounting), conductors disposed at an edge of a liquid crystal panel are joined directly to input and output ports (called input/output pads) of liquid crystal driving LSIs of a chip form with an anisotropically conductive adhesive. Thereby, the liquid crystal driving LSIs are located about the liquid crystal panel. More specifically, the liquid crystal driving LSI has the output ports connected to a signal line and a scanning line of the liquid crystal panel, and the input ports connected to a terminal conductor provided at a rim (often an outermost end) of the liquid crystal panel.

Signals including a data signal, clock signal, and source voltage for controlling an operation of the driving LSIs are called control signals. In general, the control signals are transferred via each flexible circuit board (also called flexible printed circuit, FPC), which is equipped with transmission lines (also called bus lines), and received by the terminal conductor.

The transmission of the control signals via the FPC to the driving LSIs is more advantageous than along the transmission lines provided on the liquid crystal panel in respect of the resistance in the transmission lines or the availability of the wiring space. This may also be pertinent to a liquid crystal panel of poly-silicon TFT type which has driving circuits provided at the rim of the panel.

The COG method is more favorable than the TAB method in an operation reliability a reducing of an overall product size.

FIG. 14 illustrates a conventional liquid crystal display having driving LSIs mounted by the COG method. The output and input ports of liquid crystal driving LSIs 5, 6 are joined to conductors disposed at the outward edge of a liquid crystal panel 1 with an anisotropically conductive adhesive 9. Flexible circuit boards 101 and 102 are joined to the conductors also with the anisotropically conductive adhesive 9. The flexible circuit boards 101 and 102 has other end connected to corresponding connectors 104 and 105 on an external circuit board 103, respectively. In FIG. 14, the width of the flexible circuit board 101 and the width of the flexible circuit board 102 are denoted by wy1 and wx1 respectively.

FIG. 15 is a schematic overall view of the liquid crystal panel 1. A pixel is disposed at each intersection 2 between a signal line 3 and a scanning line 4. A region of the liquid crystal panel 1 where the pixels are arranged is called an image display region, and the other region where pixels are not disposed is called a non-image display region. The signal line driving LSIs 5 for driving the signal line and the scanning line driving LSIs 6 for driving the scanning line are called driving LSIs. The terminal conductors 7 and 8 (also called connector ports) are disposde at the outward edge of the liquid crystal panel 1. The terminal conductors are classified into signal line terminal conductors and scanning line terminal conductors. The flexible circuit boards 101 and 102 are connected to the signal line terminal conductors and the scanning line terminal conductors, respectively. The circuit board 103, which often employs a printed circuit board, includes a control circuit generating the control signals.

FIG. 16 is a schematic view of a pattern of wiring on the flexible circuit board 101 or 102 and an arrangement of the terminal conductors 208 on the liquid crystal panel 1. As shown in FIG. 16, each flexible circuit board 202 includes transmission lines (bus lines) 200 for transferring the control signals and connector ports 220 corresponding to the terminal conductors 208 joined to the signal line or scanning line driving LSI, respectively. Reference numerals pi1 and pi2 denote the distance between the closest terminal conductors 208 of any two adjacent driving LSIs 206. The distance is called as an LSI pitch hereinafter. Plural driving LSIs are often disposed at various LSI pitchs, respectively.

As shown in FIG. 16, the terminal conductors 210 are connected at least to the input ports of the driving LSI 206. Other terminal conductors may be provided for connecting to a common electrode to which a reference operational voltage is applied, and to a repair line for replacing a defective signal or scanning lines.

In case that the driving LSIs are replaced with different types or their installation is modified due to a specification change in the liquid crystal panel, the LSI pitch or the number of the terminal conductors may be varied. This requires re-designing of the flexible circuit boards.

FIG. 14 illustrates an extended form of the flexible circuit boards 101 and 102. The flexible circuit boards 101 and 102 are often used as shown in FIG. 14 but may be folded to an L-shape or U-shape at the edge of the liquid crystal panel 1 in order to reduce a frame of the liquid crystal display, as not shown.

The flexible circuit boards 101 and 102 are mounted to conductors at the rim of the liquid crystal panel 1 with an anisotropically conductive adhesive 9 which is applied and heated. The board may be heated at a temperature of about 200° C. during the heating, as the flexible circuit board is thermally expanded or contracted, the pitch between the connector ports may be deviated from an original one, that is, a pitch error may be developed. If the pitch error is not negligible, the connector ports and the terminal conductors may be connected inadequately. For reducing the pitch error, the pitch between the connector ports may be thermally compensated. The greater the width of the flexible circuit boards (wy1 and wx1 in FIG. 14), the more accurate thermal compensation for the pitch measurements will be required, and thus, the compensation increases an overall cost.

If the liquid crystal panel 1 changes in a specification or screen size, the flexible circuit boards 101 and 102 has to be modified and re-designed (e.g. the overall dimensions). Such a design modification increases a cost significantly because the number of types of the flexible circuit boards has recently been increasing.

The liquid crystal panel 1 is generally inspected, after the driving LSIs are mounted, through a visual examination with a displayed target. If one of the driving LSIs 5 or 6 is found defective, the flexible circuit boards 101 and 102 is dismounted, the defective driving LSI is then replaced by a new one, and the flexible circuit boards 101 and 102 are then mounted again. That raises a cost.

When plural driving LSIs 5, 6 are employed, a data shift signal is transferred through the LSIs in sequence. If a defective driving LSI is included in the LSIs, the data shift signal after the defective driving LSI is not transferred to the succeeding LSIs, which can not thus be inspected. Therefore, the LSIs has to be inspected again after the defective driving LSI is replaced by a new one. That increases a time and cost for manufacturing the display.

A process for removing and replacing the flexible circuit boards or the driving LSIs by new, unused flexible circuit boards or driving LSIs is called as a repairing process.

It is hence an object of the present invention to provide a liquid crystal display and a method of inspecting the display which solve the foregoing problem. The display, for a variety of modifications of the screen size of a liquid crystal panel and of the mounting arrangement, may be designed freely and have a design changed easily especially even for a large sized liquid crystal panel. The display and method allow a defective driving LSI to be specified within a short time, allow the defective driving LSI or flexible circuit board to be repaired or replaced easily, and allow common components to be used. That hence decreases an overall cost and increases an operational reliability.

DISCLOSURE OF THE INVENTION

A liquid crystal display according to the present invention includes a liquid crystal panel, circuit board, and film jumper boards (denoted by FY and FX). The liquid crystal panel includes plural signal lines and scanning lines disposed in matrix, signal line driving LSIs disposed around the lines, first terminal conductors coupled to the signal lines through the signal line driving LSIs, scanning line driving LSIs, and second terminal conductors coupled to the corresponding scanning lines through the scanning line driving LSIs. The circuit board includes connector ports for driving the first and second terminal conductors of the liquid crystal panel. The film jumper boards (denoted by FY and FX) each of which includes control signal lines and dummy lines, is connected to at least one of the first terminal conductors coupled to the signal line driving LSI and the second conductor terminal coupled to the scanning line driving LSI on the liquid crystal panel.

That provides the liquid crystal display which can be easily designed and modified freely, and which has a high operational reliability and a low cost.

The liquid crystal display may include the same number of the signal line driving LSIs as that of the film jumper boards FY which respectively correspond to the signal line driving LSIs. The display may include the same number of the scanning line driving LSIs as that of the film jumper boards FX which respectively correspond to the line scanning LSIs. This allows a defective driving LSI to be repaired easily.

At least one of the film jumper boards FX, FY may include a multi-layer wire for connecting a jumper wire. This allows the film jumper board to have connector ports at one end thereof being fewer than those at the other end.

At least one of the film jumper boards FX and FY may be connected to the circuit board with an anisotropically conductive adhesive by thermocompression-bonding. This contributes to a low cost and a high operational reliability of the liquid crystal display.

The film jumper board FY may be folded from the front side to the back side of the liquid crystal panel along the edge at the end where the first terminal conductors are disposed. The film jumper board FX may be folded from the front side to the back side of the liquid crystal panel along the edge at the end where the second terminal conductors are disposed. Thereby, the liquid crystal display with a narrow frame can be implemented at lower cost.

The film jumper board FY may be connected to the circuit board and the first terminal conductors, and a flexible circuit board may have connector ports at one end connected to the second terminal conductors by thermocompression-bonding, and connector ports at the other end connected to the circuit board with a connector. The film jumper board FX is connected to the circuit board and the second terminal conductors, and a flexible circuit board may have connector ports at one end connected to the first terminal conductors by thermocompression-bonding, and connector ports at the other end connected to the circuit board with a connector. This contributes to the simply assembled construction of the liquid crystal display with a narrow frame.

A liquid crystal display includes a liquid crystal panel, circuit board, and film jumper boards. The liquid crystal panel includes plural signal and scanning lines disposed in matrix, signal line driving LSIs disposed around the lines, first terminal conductors coupled to the signal lines through the signal line driving LSIs, scanning line driving LSIs, and second terminal conductors coupled to the scanning lines through the scanning line driving LSIs. The circuit board includes connector ports for driving the first and second terminal conductors of the liquid crystal panel. The film jumper boards includes control signal lines and connector ports provided at both ends of the control signal lines. Each of the film jumper boards couples the connector ports at one end of the control signal lines with the terminal conductors of at least one of the signal line driving LSIs coupled to the first terminal conductors of the liquid crystal panel and the scanning line driving LSIs coupled to the second terminal conductors of the liquid crystal panel. A method according to the present invention for inspecting the liquid crystal display includes at least one of the steps of- (a) connecting the connector ports at other end of the film jumper board to the transmission lines for the control signals with a connector of the circuit board for the inspection; and (b) connecting between the connector ports at the other end of the film jumper board and the terminal conductors by a pressure for the inspection.

This allows a defective driving LSI or any fault on the film jumper board to be readily specified and correctly repaired fast.

The driving LSIs, if being switched between a cascade operation and single operation, allows a defective LSI to be specified easily.

DESCRIPTION OF THE PREFERRED EMBODIMENTS

Displays according to embodiments of the present invention will be described referring to the relevant drawings. Like components are denoted by like numerals as those of a conventional liquid crystal display and will be explained in no more detail.

(First Embodiment)

Figure 1:
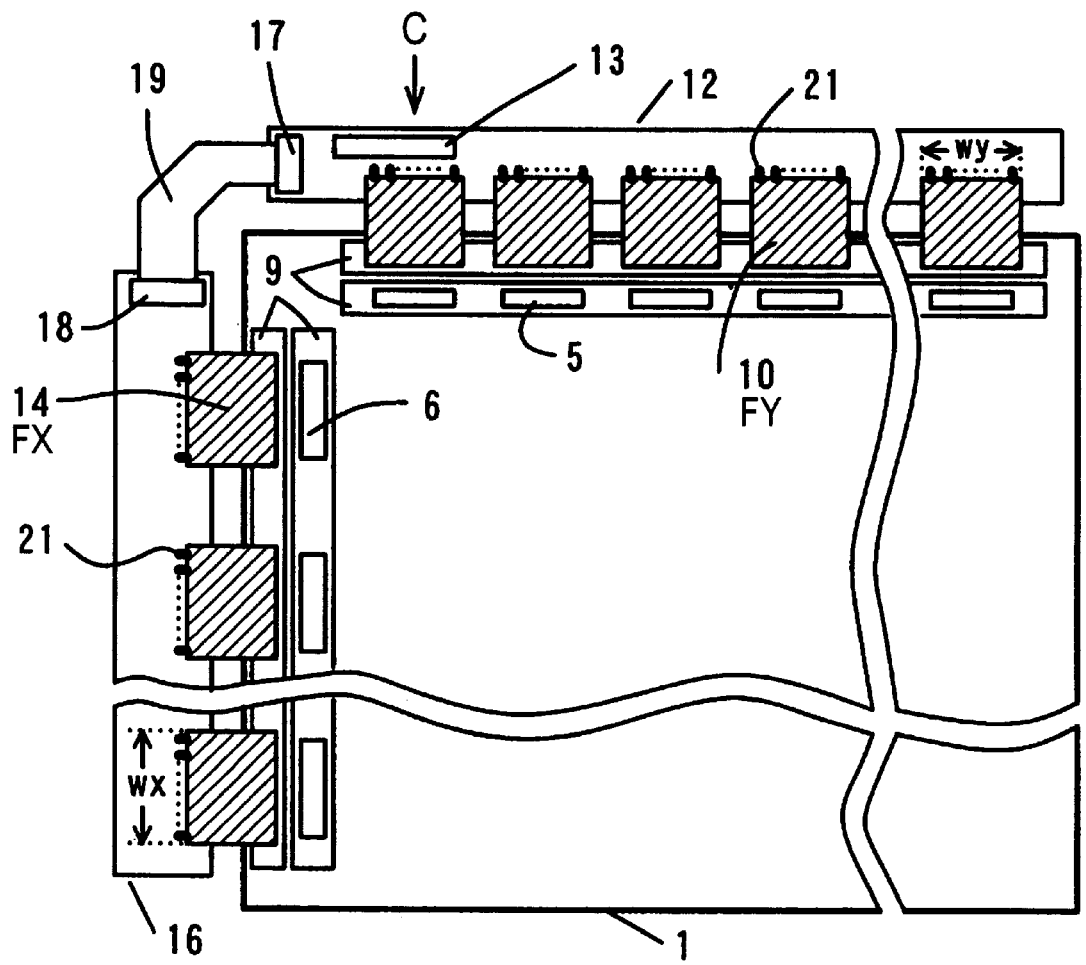
FIG. 1 is a schematic view of a primary part of a liquid crystal display according to a first embodiment of the present invention.
Figure 14:
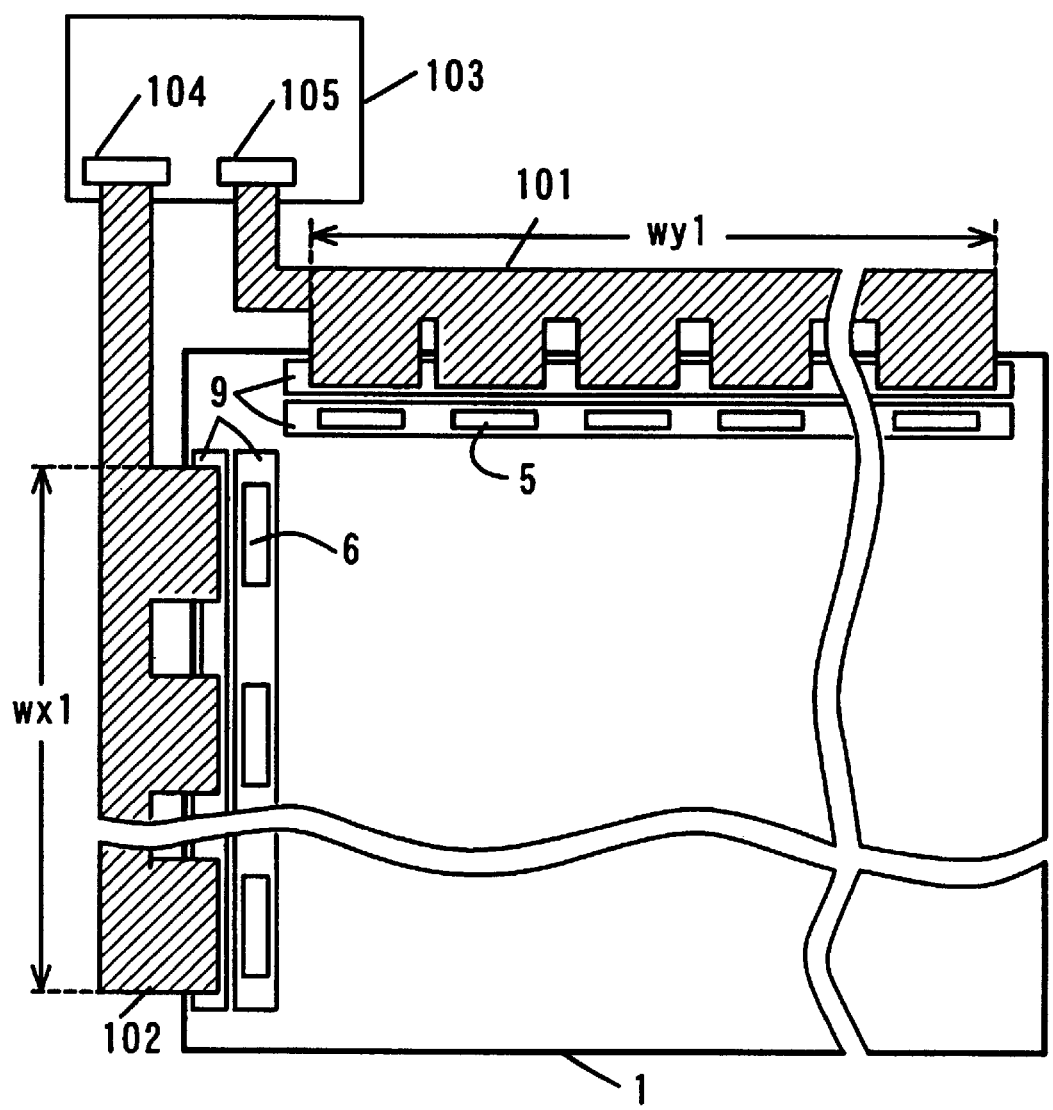
FIG. 14 is a schematic view of a primary part of a conventional liquid crystal display.
Figure 15:
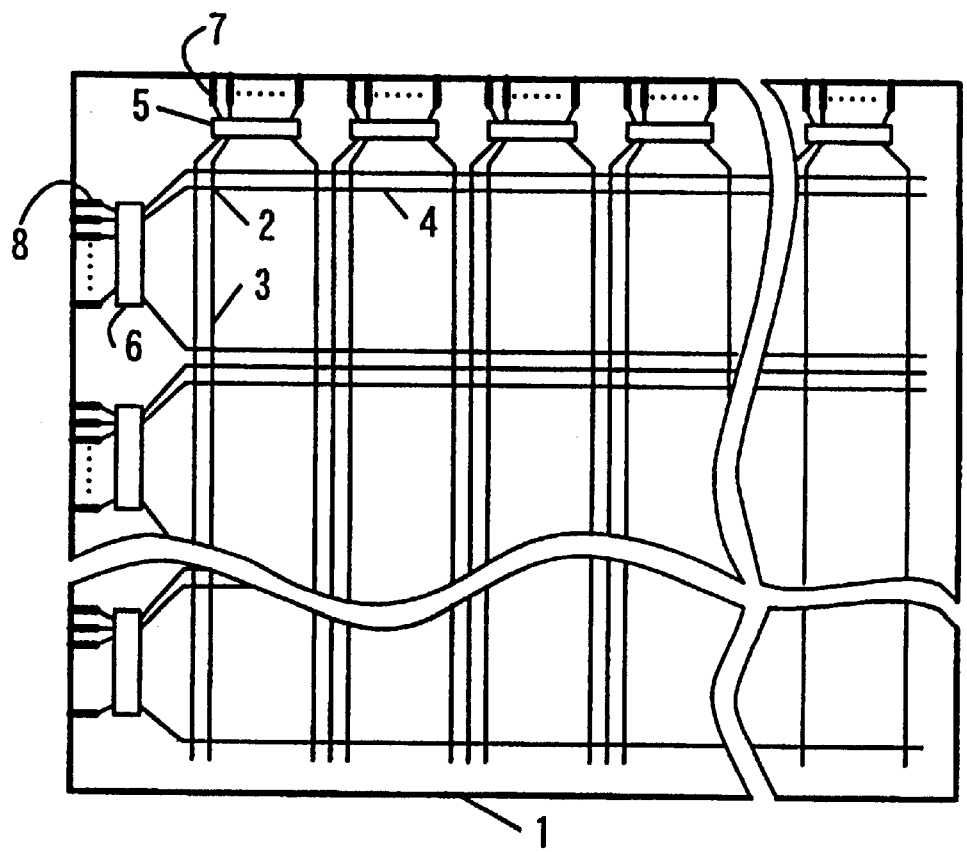
FIG. 15 is as schematic view of the liquid crystal panel.
Figure 16:
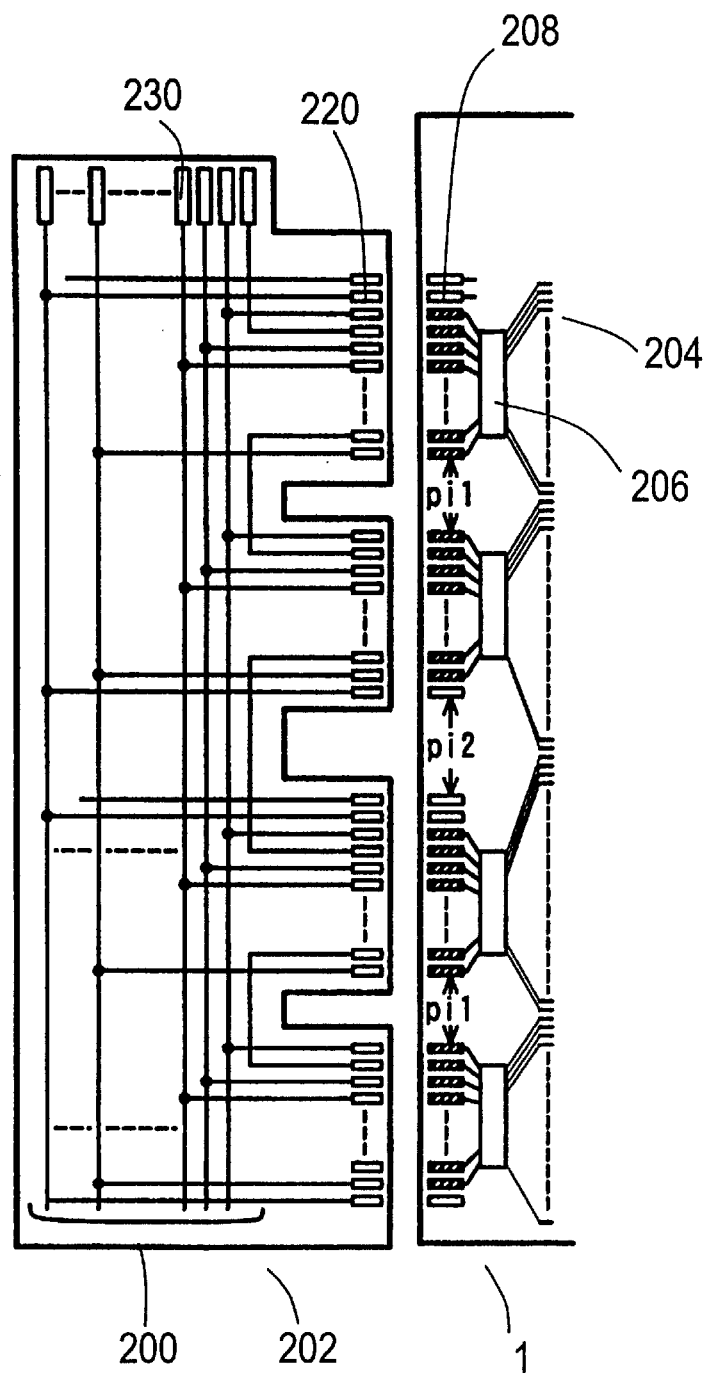
FIG. 16 is a schematic view of wiring of a flexible circuit board and an arrangement of terminal conductors.

FIG. 1 illustrates a primary part of a liquid crystal display according to a first embodiment of the present invention, in which like components are denoted by like numerals as those shown in FIGS. 14 to 16. A liquid crystal panel 1 is identical to that shown in FIG. 15 and will be explained in no more detail. Signal line film jumper circuit boards 10 and scanning line film jumper circuit boards 14 are referred in general to as film jumper boards F and thus denoted by FY and FX, respectively, for an easy description. Each film jumper board includes connector ports provided at both ends of the board and jumper wires connecting between the connector ports. The film jumper boards may be often made of polyimide resin material, which is much flexible.

A circuit board including transmission lines patterned for supplying control signals C is divided into a signal line circuit board 12 and a scanning line circuit board 16. The control signal is input from a connector 13 to the signal line circuit board 12 and also input to the scanning line circuit board 16 via connectors 17, 18 and a connecting cable 19 between the two connectors. The connecting cable 19 may be soldered directly while the connector 17 and/or connector 18 is eliminated.

Driving LSIs 5 and 6 are disposed at a rim of the liquid crystal panel 1. The jumper boards FY and FX have one end connected to the signal line circuit board 12 and the scanning line circuit board 16, respectively, and have the other end connected to terminal conductors 7 and 8 of the liquid crystal panel 1 (FIG. 15), respectively. A source voltage, data signals, clock T signals, and other control signals are input to the driving LSIs through the circuit boards 12, 16 and the jumper boards FY, FX. Reference symbols wy and wx denote the width of the jumper board FY and the width of the jumper board FX, respectively. The terminal conductors connected to the driving LSI are spaced at equal intervals of a pitch pt as shown in FIG. 2. The driving LSIs are disposed at intervals pi1 and pi2, which may not however be deferent from each other (See FIG. 16).

Figure 2A:
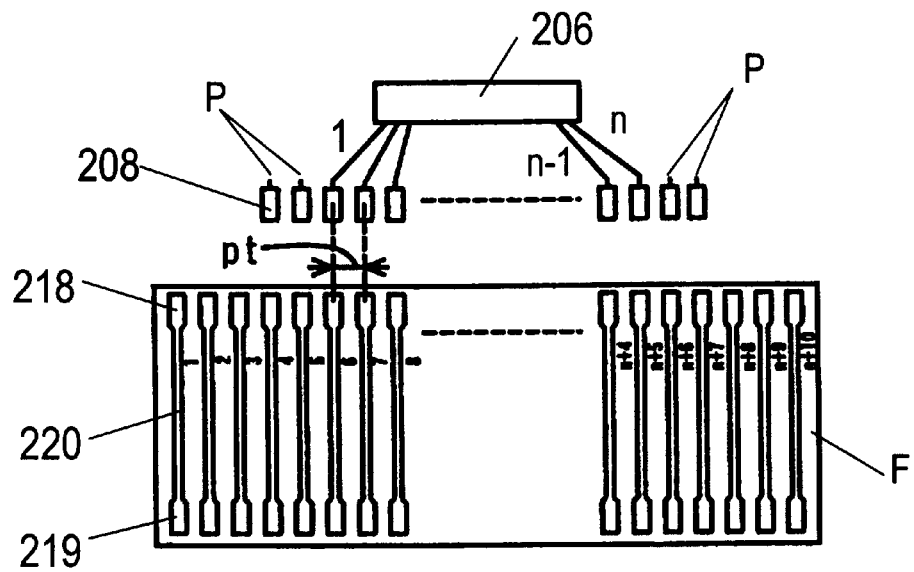
FIGS. 2A and 2B show a relationship between jumper wires, connector ports formed on a film jumper board, and corresponding terminal conductors.
Figure 2B:
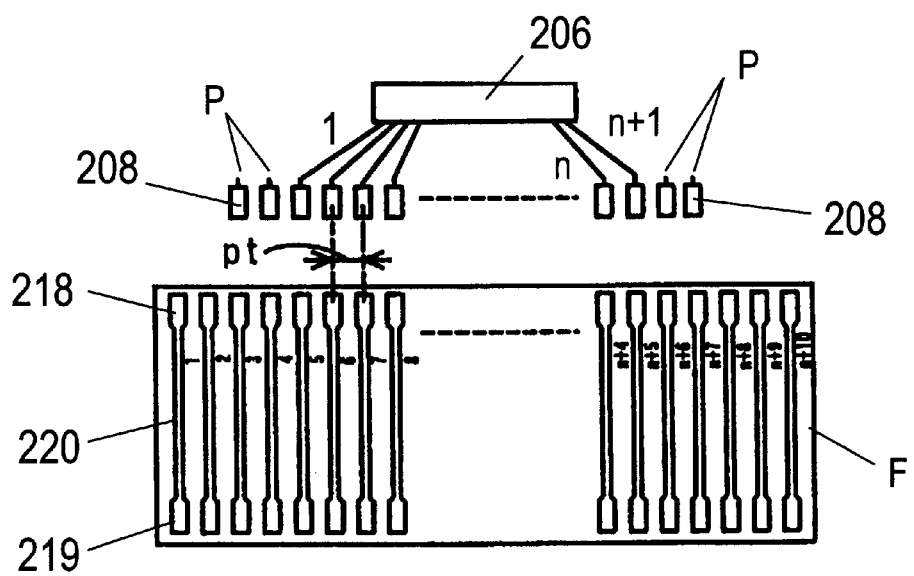

FIGS. 2A and 2B illustrate the relation between the connector ports 218 of jumper wires 220 on the film jumper board F and the terminal conductors 208 on the liquid crystal panel 1. The terminal conductors 208 are classified into signal ports 1 to n and ports P. The signal ports 1 to n are electrically connected to the input ports of the driving LSI 206. The ports P include ports connected to a common electrode of the liquid crystal panel 1, a repair wire for repairing a broken signal or scanning lines, and a dummy ports connected to nothing. The driving LSIs may thus correspond to a different number of the terminal conductors (See FIG. 16). For example, in case that the number of the terminal conductors P may be varied, this may prevent a single type of the jumper board FY or FX for being used. A different type of the liquid crystal panel, which thus includes different driving LSIs, prevents a single type of the jumper board FY or FX from being used.

Therefore, upon having jumper wires including control a signal line and a dummy line, a single type of FY or FX can be accordingly even if the number of the terminal conductors corresponding to the driving LSIs is different.

FIG. 2A illustrates the film jumper board F and the terminal conductors 208 corresponding to a driving LSI 206 having n signal input ports. The terminal conductors 208 include n signal ports and four ports P. The jumper wires 220 include n control signal lines and ten dummy lines. As the total number of the terminal conductors 208 is n+4, six of the jumper wires 220 are not connected.

FIG. 2B illustrates the film jumper board F and the terminal conductors 208 corresponding to a driving LSI 206 having n+1 signal input ports. The total number of the terminal conductors 208 is n+5. Because having one of the ten dummy lines which is used as the control signal line, the film jumper board can be identical to that shown in FIG. 2A. This can be applied regardless of the number of the ports P being different between the driving LSIs 206, although not shown. The film jumper board of this embodiment can commonly be utilized without modification. The signal line driving LSIs has a different number of control signal lines than the scanning line driving LSIs. The number of the control signal lines of a signal line driving LSI is usually greater than that of a scanning line driving LSI.

The connector ports 218 of the film jumper board F and the corresponding terminal conductors 208 on the liquid crystal panel 1 are thrmocompression-bonded to each other by heating and applying a pressure with an anisotropically conductive adhesive 9 at a temperature of about 200° C. The other connector ports 219 of the film jumper board F are connected to the circuit board by soldering or thermocompression-bonding.

The widths wy and wx of the film jumper board F are smaller than the widths wy1 and wx1 of a flexible circuit board for a conventional liquid crystal display (See FIG. 14), respectively. Therefore, a pitch error caused by thermal expansion or contraction affects the boards less than the conventional one. When the driving LSIs 5 and 6 are accompanied with one film jumper board FY and one film jumper board FX, respectively, as shown in FIG. 1, the pitch error may further be declined.

Figure 3A:
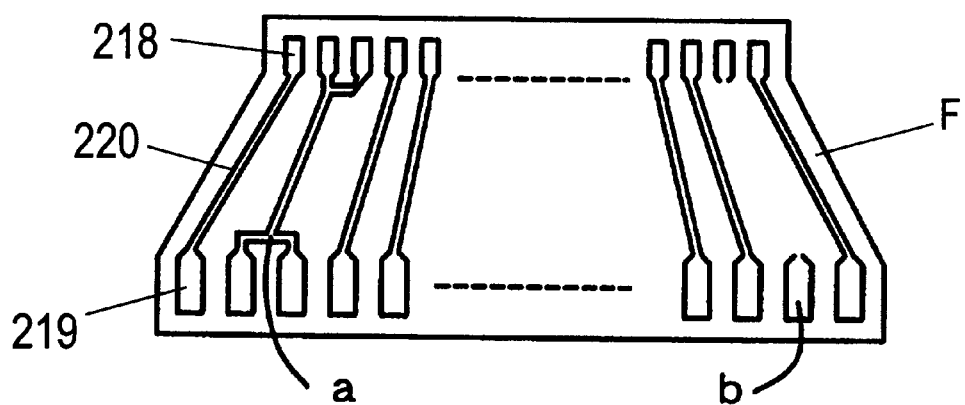
FIGS. 3A and 3B show another patterns of the jumper wires on the film jumper board than those shown in FIGS. 2A and 2B.
Figure 3B:
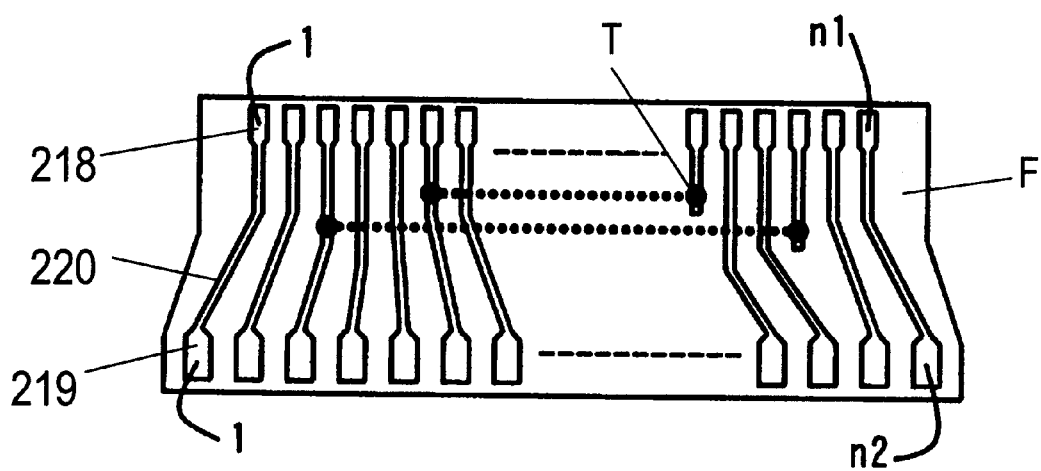

FIGS. 3A and 3B illustrate other patterns of the wires on the film jumper board than those shown in FIG. 2A. FIG. 3A shows a pattern including the following cases (1), (2), and (3):

(1) The ports 218 are disposed at a different pitch from the other ports 219;

(2) Two adjoining ports are jointed to each other by a jumper wire a (FIG. 3A); and (3) Two opposing ports 218 and 219 are not jointed (as denoted by b in FIG. 3A).

The pattern may includes at least one of the three cases (1), (2), and (3).

FIG. 3B illustrates a film jumper board including wiring patterns formed on both sides of the board. Jumper wires are formed on one side, and a wire denoted by the dotted line is formed on the other side. The wires formed on the both sides are connected to each other with a through hole T. Such a multi-layer wiring arrangement (two layers in FIG. 3B) on the film jumper board allows the number of the ports to be different between the two ends (n1>n2 in FIG. 3B). This type of the film jumper board can significantly be advantageous when a single voltage or signal is applied to plural terminal conductors for one driving LSI.

The pitch between the terminal conductors on the liquid crystal panel 1 is denoted by lcpt (not shown). Although lcpt=pt is desired, the thermal expansion and contraction of the pitch lpct negligible for that of the pitch pt. As varying according to an influence of thermocompression-bonding, the pitch pt may be deviated from the pitch lcpt. The pitch difference Δ is calculated by:

$$\Delta = lcpt - pt.$$

A dimensional accuracy corresponds to a small pitch difference (that is also desirable on the flexible circuit boards 101 and 102). When the pitch difference exceeding the width of the connector port on the film jumper board causes a connection error.

An amount of a thermal expansion or contraction of the flexible circuit board and jumper boards FX, FY is expressed by:

$$(\text{Amount of Thermal Expansion or Contraction}) = kt \times T \times w \quad (1)$$

where, kt (mm/° C.) is a thermal expansion or contraction coefficient of the jumper boards FY and FX, T is a temperature, and w is the width of the jumper boards FY and FX.

An amount of a thermal expansion or contraction of the flexible circuit boards 101 and 102 is also expressed by the equation (1). Then, the ratio Ry of thermal expansion or contraction between the jumper board FY and the flexible circuit board 101 and the ratio Rx of thermal expansion or contraction between the jumper board FX and the flexible circuit board 102 are expressed by the equation (2):

$$Ry = wy/w1, \quad Rx = wx/w2 \quad (2)$$

Since wy<w1 and wx<w2, the pitch errors on the jumper boards FY and FX can be reduced. For example, when the width of the film jumper board is 1/10 the width of the flexible circuit board, the amount of the thermal expansion or contraction of the jumper boards becomes 1/10 of that of the flexible circuit board. Therefore, as having the improved dimensional accuracy, the jumper boards do not require a trial production to be repeated for determining a temperature compensation to reduce the pitch error.

Also, if each driving LSI corresponds to each film jumper board as shown in FIG. 1, a defective LSI can easily be replaced by a new LSI.

Moreover, one particular type of the film jumper boards can commonly be used between different liquid crystal panels.

Including the case, which will be described later, that the film jumper boards does not correspond to the driving LSIs one by one, each film jumper boards may be fabricated with a simple, low-cost punching die, and have a simple wiring patter (See FIG. 2).

As described, the liquid crystal display employing the film jumper board of this embodiment can be designed freely and easily, hence having a reduced cost and increased operational reliability.

While the circuit board shown in FIG. 1 incorporates the signal line circuit board 12 and scanning line circuit board 16 into which the circuit board is divided, the circuit board may consist of a single circuit board. The circuit boards 12 and 16 may be joined to the respective jumper boards FY and FX by not only soldering but also thermocompression-bonding with an anisotropically conductive adhesive. The thermocompression-bonding with an anisotropically conductive adhesive having a reduced cost and high reliability can thus be used because the film jumper boards of this embodiment have a smaller width than the conventional flexible circuit boards.

The driving LSIs may not correspond the film jumper boards one by one, plural film jumper boards may correspond to a signal driving LSI (not shown). This is effective for the driving LSI having a large number of input ports (for example, 50 or more). One film jumper board arranged can correspond commonly to n1 signal input ports of a first driving LSI and n2 signal input ports of a second driving LSI.

(Second Embodiment)

Figure 4:
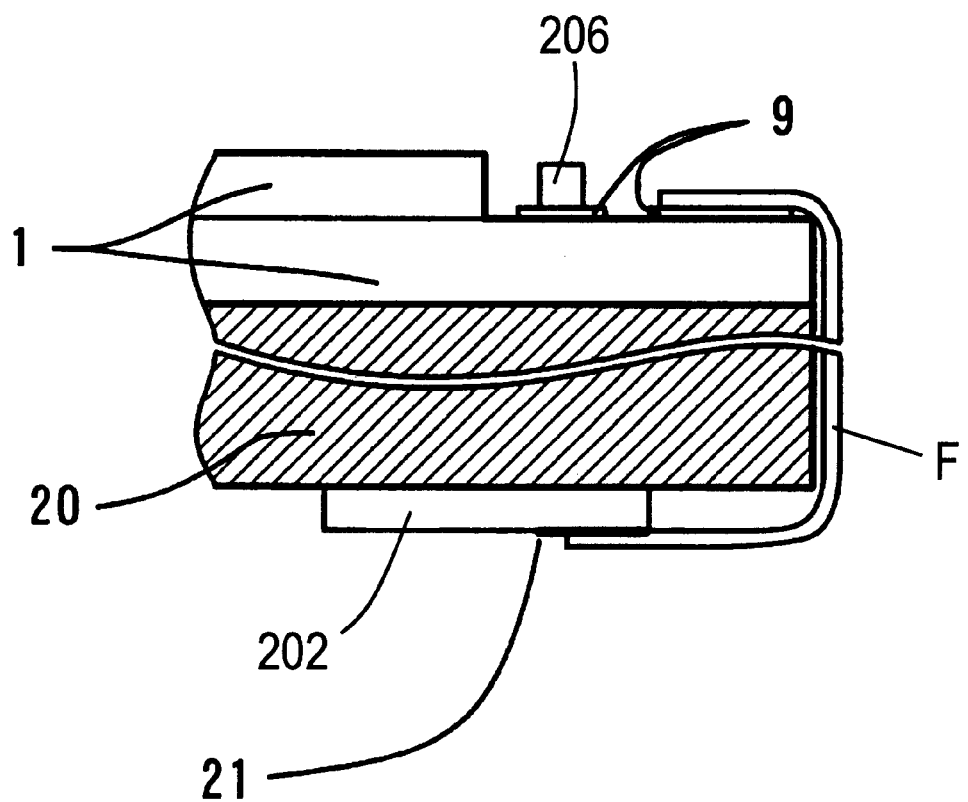
FIG. 4 is a cross sectional view of a primary part of a liquid crystal display according to a second embodiment of the invention.

FIG. 4 is a cross sectional view of a primary part of a liquid crystal display according to a second embodiment of the present invention. The cross section is taken in parallel with the signal or scanning line of a liquid crystal panel 1.

A back light unit 20 is mounted to the back of the liquid crystal panel 1, and a circuit board 202 is disposed at the unit. A film jumper board F is folded along the edge of the liquid crystal panel 1 to connect between the liquid crystal panel 1 and the circuit board 202. FIG. 4 shows the liquid crystal display having such a narrow frame assembly and other arrangement, which is identical to that in FIG. 1.

The film jumper board F of this embodiment has a lower cost and smaller width than the conventional flexible circuit boards, thus being highly elastic and foldable. As a result, the liquid crystal display of a narrow frame type can easily be implemented at a lower cost.

While both the signal line and scanning line film jumper boards are foldable in this embodiment, only either of them can be folded.

(Third Embodiment)

Figure 5:
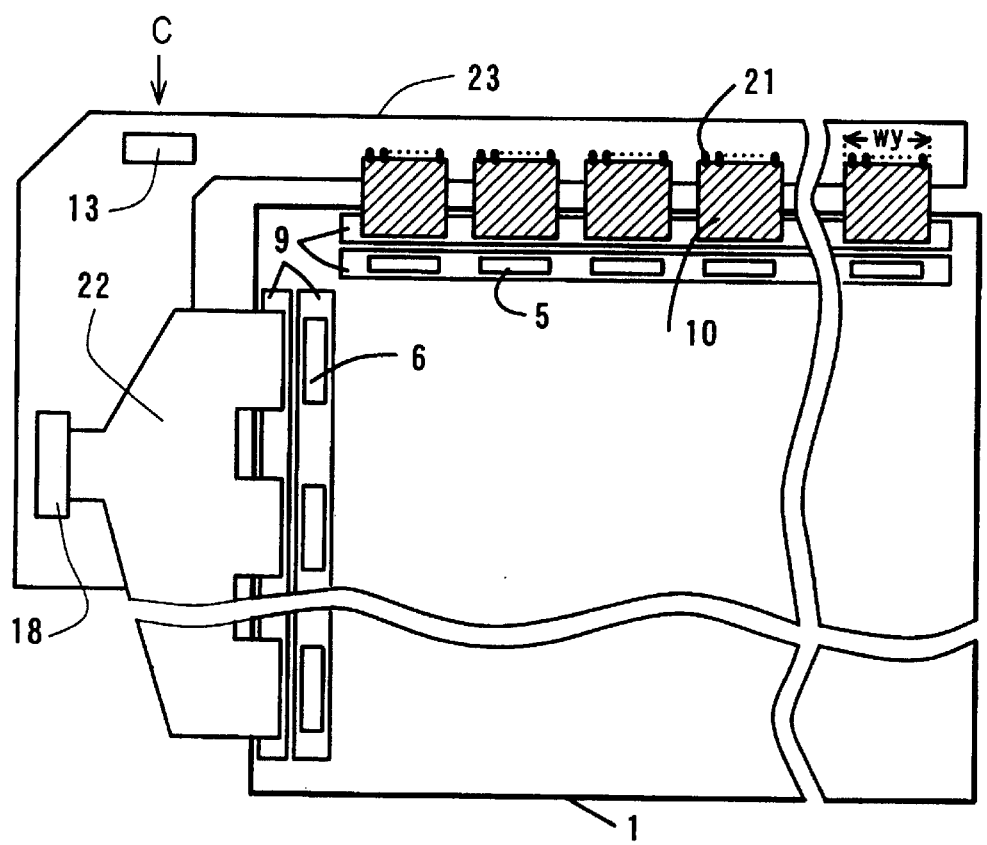
FIG. 5 is a cross sectional view of a primary part of a liquid crystal display according to a third embodiment of the invention.

FIG. 5 is a schematic view of a primary part of a liquid crystal display according to a third embodiment of the present invention. A circuit board 23 including a signal line circuit board and a scanning line circuit board integrated unitarily is coupled to the signal line terminal conductors of a liquid crystal panel 1 with a film jumper board FY. A flexible circuit board 22 has connector ports connected to the scanning line terminal conductors of the liquid crystal panel 1 by thermocompression-bonding, and has the other connector ports connected to the circuit board 23 with a connector 18. The flexible circuit board 22 is substantially identical to that shown in FIG. 14.

Alternatively, the circuit board 23 may be coupled to the terminal conductors of the scanning lines with the jumper board FX and coupled to the flexible circuit board which is connected to the terminal conductors of the signal lines with a connector. In any case, a power source circuit and a control circuit for generating control signals may be mounted on the circuit board 23.

Similar to FIG. 2, the film jumper board and the flexible circuit board may be folded to form a narrow frame assembly. This arrangement is effective for a small sized type of the liquid crystal display having a few (2 or 3) of the LSIs. Since being coupled to the circuit board 22 with a connector, the flexible circuit board 23 can be detached easily from the circuit board 22, thus contributing to the easy assembling of the liquid crystal display.

(Fourth Embodiment)

A liquid crystal display according to a fourth embodiment of the present invention will be described. The liquid crystal display according to this embodiment employs a film jumper board F shown in FIG. 6A or 6B.

Figure 6A:
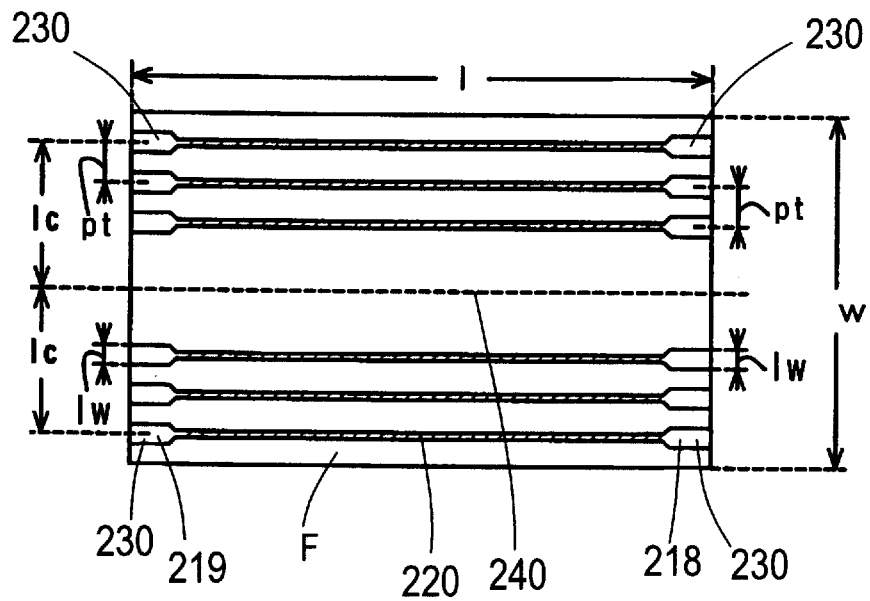
FIGS. 6A and 6B are schematic views of a film jumper board in a liquid crystal display according to a fourth embodiment of the invention.
Figure 6B:
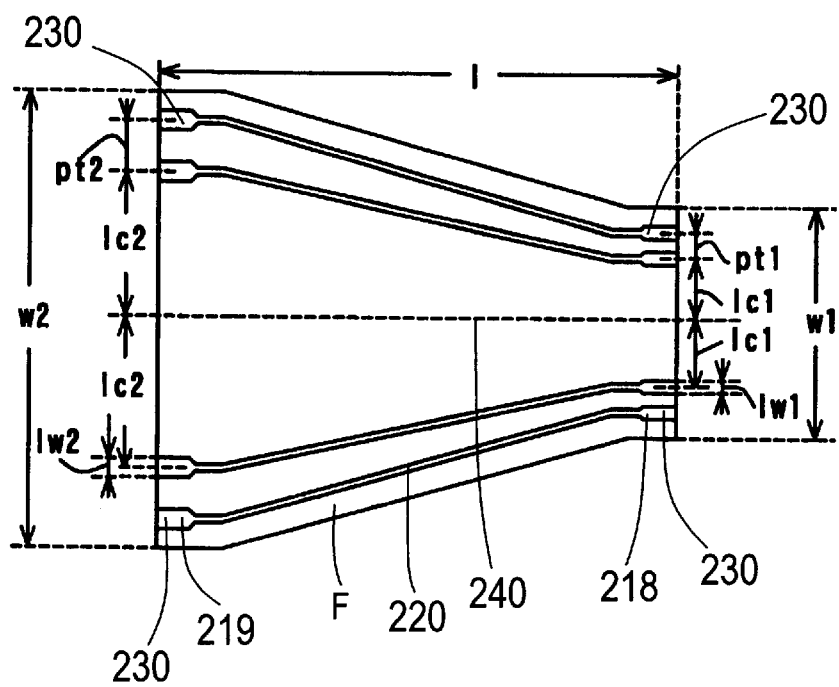

Referring to FIGS. 6A and 6B, reference symbols lw, lw1, and lw2 denotes the width of connector ports. Reference symbols pt, pt1, and pt2 denotes the pitch between the connector ports. A reference symbol 1 denotes the length of the film jumper board. Reference symbols w, w1, and w2 denote the width of the film jumper board. Reference numeral 230 denotes a connector port disposed on each outermost end the film jumper board.

FIG. 6A illustrates a film jumper board F including connector ports 230 disposed on the outer edge thereof at a pitch pt. Respective center lines of the outermost connector ports 230 at both ends of the film jumper board F shown in FIG. 6A are identical to each other. That is, the outermost connector ports 230 are arranged symmetrically about a center line 240. Reference symbol lc denotes the distance from the center line 240 to the outermost connector ports 230.

FIG. 6B illustrates a film jumper board F including connector ports 218 disposed at one end thereof at a pitch pt1, and connector ports 219 disposed at the other end thereof at a pitch pt2. A center lines between the outermost connector ports 230 at one end of the film jumper board F shown in FIG. 6B and that between the outermost connector ports 230 at the other end is identical to each other. That is, the outermost connector ports 230 are arranged symmetrically about the center line 240. Reference symbols lc1 and lc2 denote the distances from the center line 240 to the outermost connector ports 230 at both ends, respectively. The film jumper boards shown in FIGS. 6A and 6B are referred to as center-line-symmetrical film jumper boards F (FY, FX) hereinafter. The center line symmetrical film jumper boards allow connector terminals of a circuit board coupled with the film jumper boards to be arranged efficiently and precisely, thus contributing to a rational designing of the liquid crystal display.

(Fifth Embodiment)

A liquid crystal display according to a fifth embodiment of the present invention will be described with referring to FIGS. 7 and 8.

Figure 7:
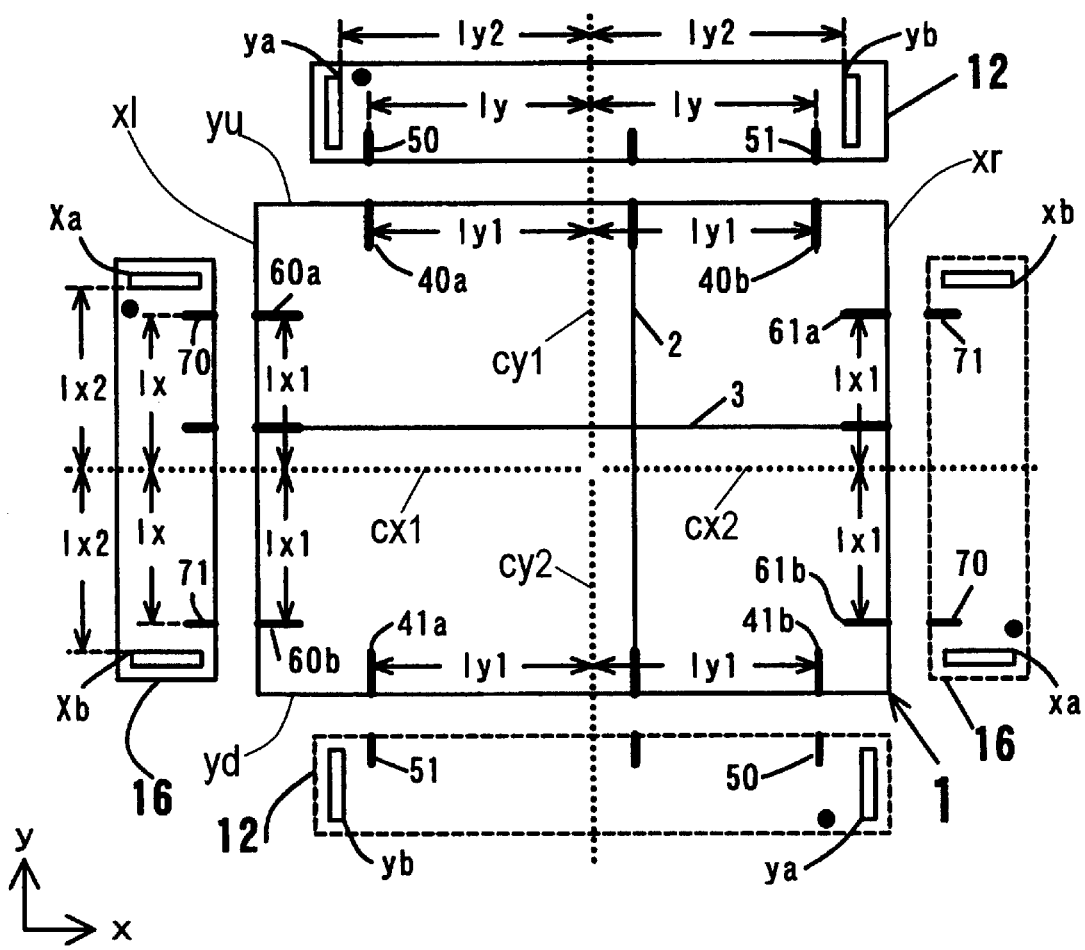
FIG. 7 shows an arrangement of a liquid crystal panel and circuit boards according to a fifth embodiment of the invention.

FIG. 7 is a diagram showing the arrangement of a liquid crystal panel and circuit boards. In FIG. 7, a signal line 2 extends in a y-direction, a scanning line 3 extends in a x-direction, and the four sides of a liquid crystal panel 1 are edges Xl, Xr, Yu, and Yd.

Reference numerals 40a, 40b, 40c, and 40d denote the outermost ones (closest to the edges Xl and Xr) of signal line terminal conductors disposed along the Yu and Yd edges. Similarly, reference numerals 60a, 60b, 61a, and 61b denote the outermost ones (closest to the edges Yu and Yd) of scanning line terminal conductors disposed along the Xl and Xr.

Each of the signal line terminal conductors and the scanning line terminal conductors is often located at one side of the panel. FIG. 7 shows the terminal conductors disposed along all the four sides for description, in which jumper boards FY and FX are omitted.

Reference symbol cy1 denotes a Y-center line between the outermost terminal conductors 40a and 40b. Reference symbol cy2 denotes a Y-center line between the outermost terminal conductors 41a and 41b. Reference symbol cx1 denotes an X-center line between the outermost terminal conductors 60a and 60b. Reference numeral cx2 denotes an X-center line between the outermost terminal conductors 61a and 61b. The terminal conductors disposed at the edge Yu are arranged symmetrically about the Y-center line cy1. The terminal conductors disposed at the edge Yd are arranged symmetrically about the Y-center line cy2. Similarly, the terminal conductors disposed at the edge Xl are arranged symmetrically about the X-center line cx1. The terminal conductors disposed at the edge Xr are arranged symmetrically about the X-center line cx2. Reference symbol ly1 denotes the distance between the Y-center line cy1 and a center of the terminal port 40a, and also denotes the distance between the Y-center line cy1 and a center of the terminal port 40b, the distance between the Y-center line cy2 and a center of the terminal port 41a, and the distance between the Y-center line cy2 and a center of the terminal port 41b. Reference symbol lx1 denotes the distance between the X-center line cx1 and a center of the terminal port 60a, and also denotes the distance between the X-center line cx1 and a center of the terminal port 60b, the distance between the X-center line cx2 and a center of the terminal port 61a, and the distance between the X-center line cx2 and a center of the terminal port 61b. The Y-center lines cy1 and cy2 may not aligned with each other, and the X-center lines cx1 and cx2 may not be aligned with each other. This arrangement of the terminal conductors allows the liquid crystal display to be rationally modified in the design even if the liquid crystal panel has the terminal conductors disposed at an opposite edge of the panel.

A signal line circuit board 12 includes connector ports 50 and 51 provided thereon corresponding to the connector ports 40a and 40b, respectively. A scanning line circuit board 16 includes connector ports 70 and 71 provided thereon corresponding to the connector ports 60a and 60b, respectively. Reference symbols xa, xb, ya, and yb denote positions of connectors for connecting cables. The ports 50 and 51 are located symmetrically to each other about the Y-center line cy1, and the positions ya and yb are also located symmetrically to each other about the Y-center line cy1. Similarly, the ports 70 and 71 are located symmetrically to each other about the X-center line cx1, and the positions xa and xb are locxated symmetrically to each other about the X-center line cx1.

Figure 8A:
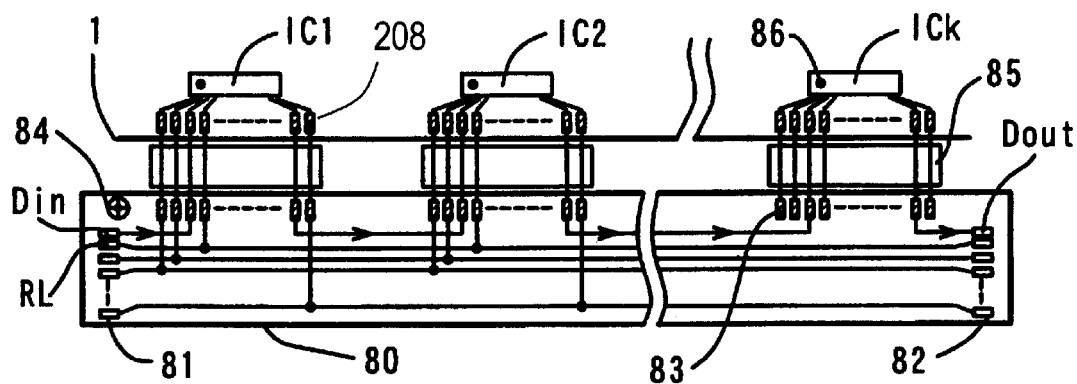
FIGS. 8A and 8B show patterns of the jumper wires of the circuit board.
Figure 8B:
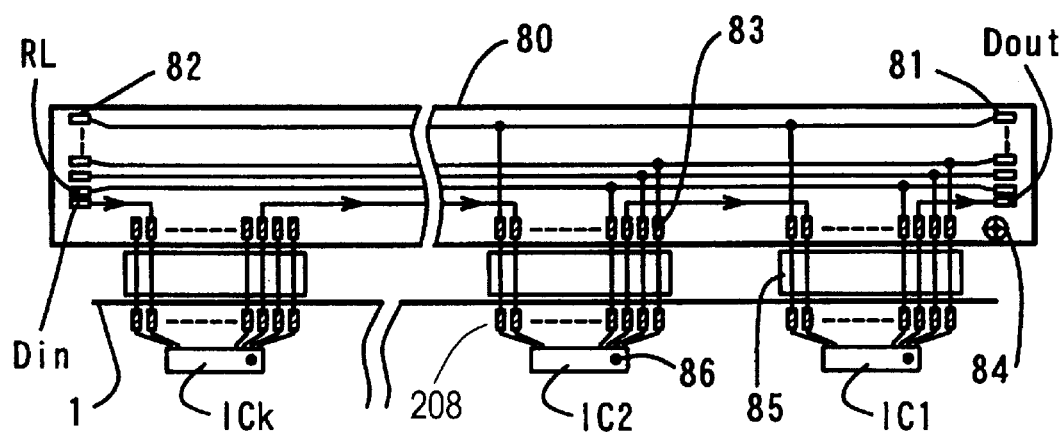

FIGS. 8A and 8B illustrate transmission lines disposed on the circuit board. Reference symbols IC1, IC2, . . . , and Ick denotes k driving LSIs, Reference numeral 80 denotes a circuit board. Reference numerals 81 and 82 denote control signal input ports (may denote connector ports for coupling the circuit boards). Reference numeral 83 denotes a connector port. Reference numeral 85 denotes a film jumper board. Reference numeral 84 and 86 denote position marks. Reference symbol RL denotes a shift signal Reference symbol Din denotes an input shift data signal. Reference symbol Dout denotes an output shift data signal. FIGS. 8A and 8B show circuit boards (denoted by reference numerals 12, 16 and denoted by the dotted lines in FIG. 7) having the terminal conductors provided oppositely to each other, respectively.

FIG. 8A shows a circuit board opposing to the edge Yd of the liquid crystal panel 1, in which the control signals excluding Din are input into the driving LSI in parallel. The signal Din is input into the first driving LSI IC1 in FIG. 8A, and then, regarding the driving LSI IC2 and so on, the output shift data signal of the preceding driving LSI is transferred to the succeeding driving LSI. Finally, the output shift data signal of the driving LSI ICl is released to the connector port 82. This arrangement of the driving LSIs is called as a cascade connection.

The terminal conductors shown in FIG. 8B are disposed on the opposite side (the edge Yu). As shifting in the reversed direction, the signal Din is input into the last driving LSI Ick, and the signal Dout is released from the first driving LSI IC1. The driving LSIs have a function of reversing a sifting direction in which a signal shifts. Reference symbol RL denotes a signal for reversing the shifting direction. This allows the circuit board 80 including the input ports 81 and 82 to be equally used even if the driving LSIs are disposed at an opposite edge. Alternatively, either the control signal input ports 81 or 82 may be used as the Din terminal for the driving LSIs IC 1 and ICk.

As described above, even if the terminal conductors are disposed at an opposite edge, the circuit board does not have to changed and can equally be used, thus contributing to the component sharing and the rational designing of the liquid crystal display. This is effective particularly for the signal or scanning lines are provided at both edges.

If being located at positions Xa, Xb or poeitions Ya, Yb, respectively the input ports 80 and 82 allows the circuit boards to be connected to each other easily. The center line symmetrical film jumper board described above allows the liquid crystal display of this embodiment to be designed rationally and to have a reduced cost. While FIGS. 7, 8A, and 8B show the circuit boards divided into the signal line and the scanning line, the technique can be applied to a circuit board including the signal line and scanning line integrated.

(Sixth Embodiment)

Figure 9:
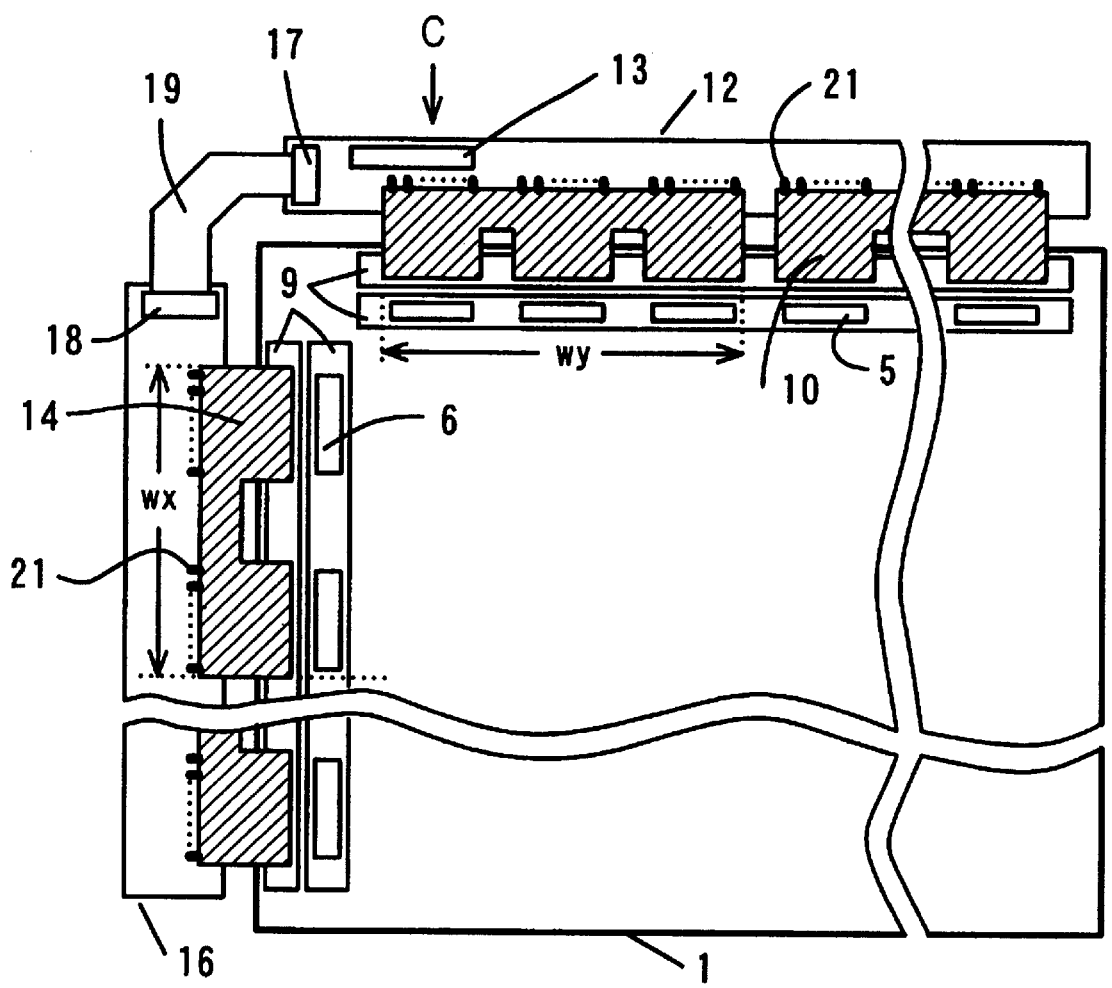
FIG. 9 shows an arrangement of circuit boards in a liquid crystal display according to a sixth embodiment of the invention.

FIG. 9 illustrates a liquid crystal display according to a sixth embodiment of the present invention. As a single film jumper board provided for plural driving LSIs, a film jumper board 10 is provided for three signal line driving LSIs, while a film jumper board 14 is provided for two scanning line driving LSIs. The other arrangement is identical to that shown in FIG. 1.

The arrangement of the multiple driving LSIs on each film jumper board shown in FIG. 9 is particularly effective for a large-screen liquid crystal panel including more driving LSIs. Four or five scanning line driving LSIs may be used at most, ten or more signal line driving LSIs may be used.

The film jumper board corresponding to plural LSIs may have disadvantage for the pitch error because the board is wider than a jumper board corresponding to a single LSI.

However, if the pitch error caused by the thermal expansion or contraction which is calculated from the equations (1) and (2) is limited to a certain range, the liquid crystal display still has the advantage of this embodiment, i.e., a smaller number of the film jumper boards, and thus has a reduced cost. The pitch error within the certain range means a pitch error not exceeding than the width of each connector port of the film jumper board.

(Seventh Embodiment)

Figure 10:
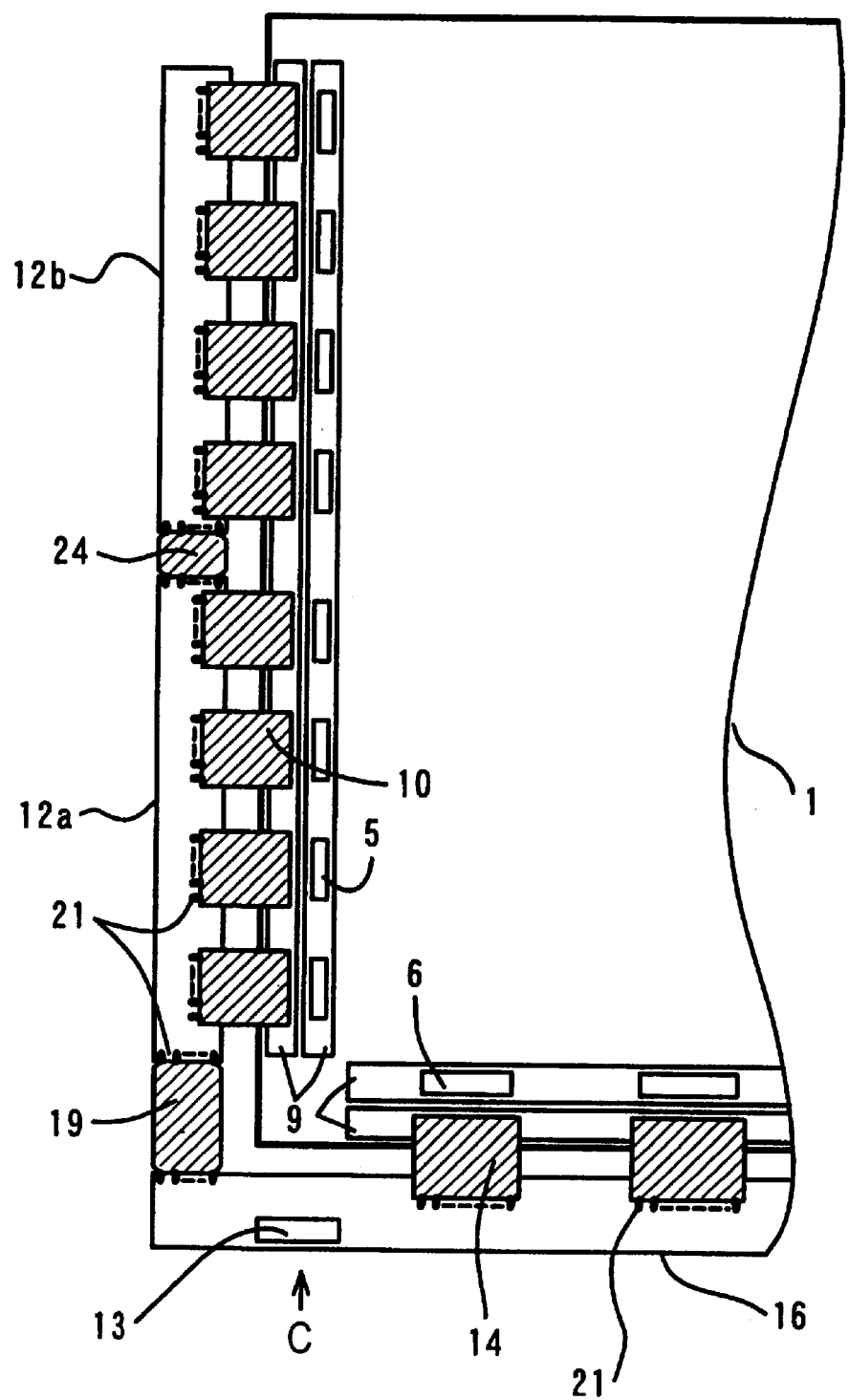
FIG. 10 shows an arrangement of circuit boards in a liquid crystal display according to a seventh embodiment of the invention.

FIG. 10 illustrates a liquid crystal display according to a seventh embodiment of the present invention. The signal line circuit board 12 shown in FIG. 1 is separated into two boards 12a and 12b which are connected to each other with a separated board connecting cable 24. The other arrangement is identical to that shown in FIG. 1. While the signal line circuit board shown in FIG. 10 is separated into two boards, it may be divided into three boards. Alternatively, the scanning line circuit board may also be separated into plural boards.

According to the arrangement of the seventh embodiment, the thermal expansion or contraction of the circuit boards can be reduced, thus improving the dimensional accuracy. This embodiment is particularly effective for a liquid crystal display is equipped with a large screen.

(Eighth Embodiment)

Figure 11:
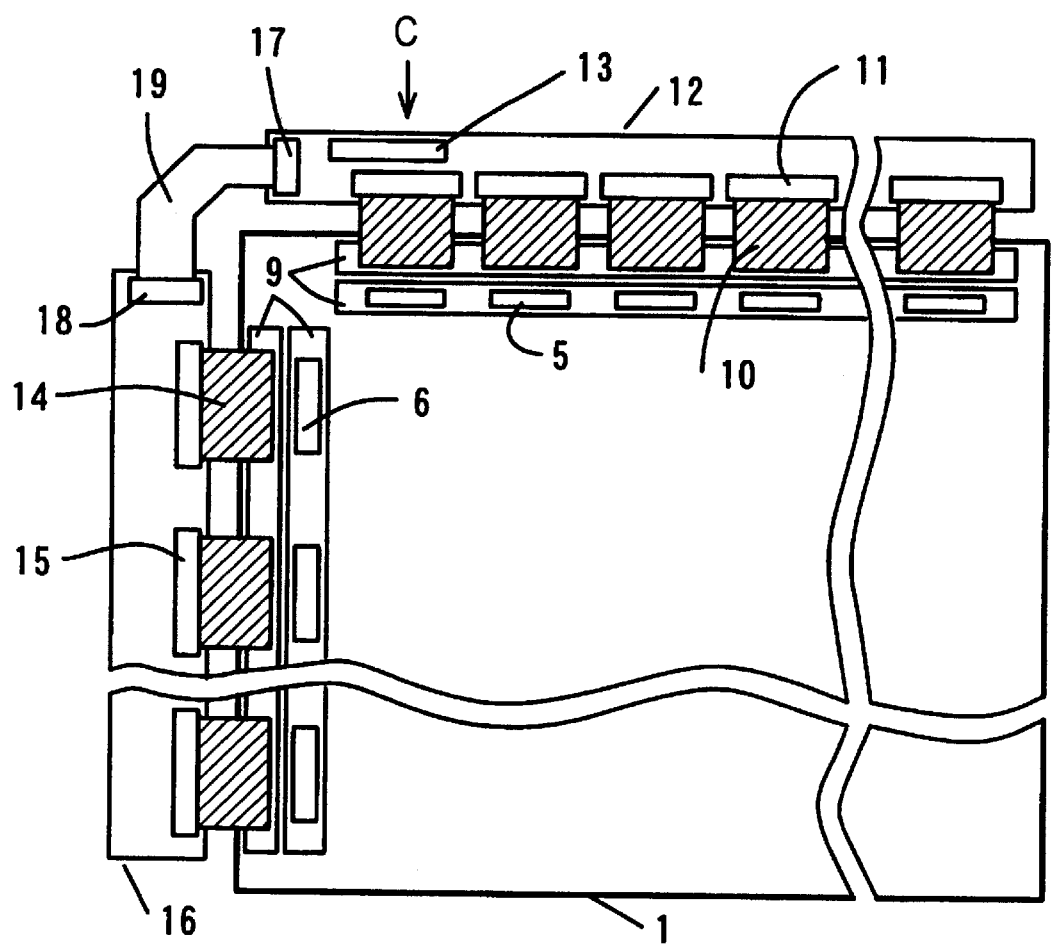
FIG. 11 is a schematic view showing a method of inspecting a liquid crystal display according to a eighth embodiment of the invention.

FIG. 11 is a schematic view showing a method of inspecting a liquid crystal display according to a eighth embodiment of the present invention. In an inspecting method according to this embodiment, the liquid crystal display, which includes circuit boards 12 and 16 having connectors 11 and 15 for easily detaching from film jumper boards FY and FX, is examined with an image appropriate for an inspection displayed on the display. The film jumper boards FY and FX are coupled to a liquid crystal panel 1 by thermocompression-bonding. The arrangement shown in FIG. 11 is identical to that shown in FIG. 1 except the connectors 11 and 15 and will be explained in no more detail. According to this embodiment, the circuit boards 12 and 16 having the respective connectors 11 and 15 are easily attached to and detached from the film-jumper boards 10 and 14. Accordingly, if any film jumper board or driving LSI is found defective, the defective one can be replaced by a new one readily and correctly.

Figure 12:
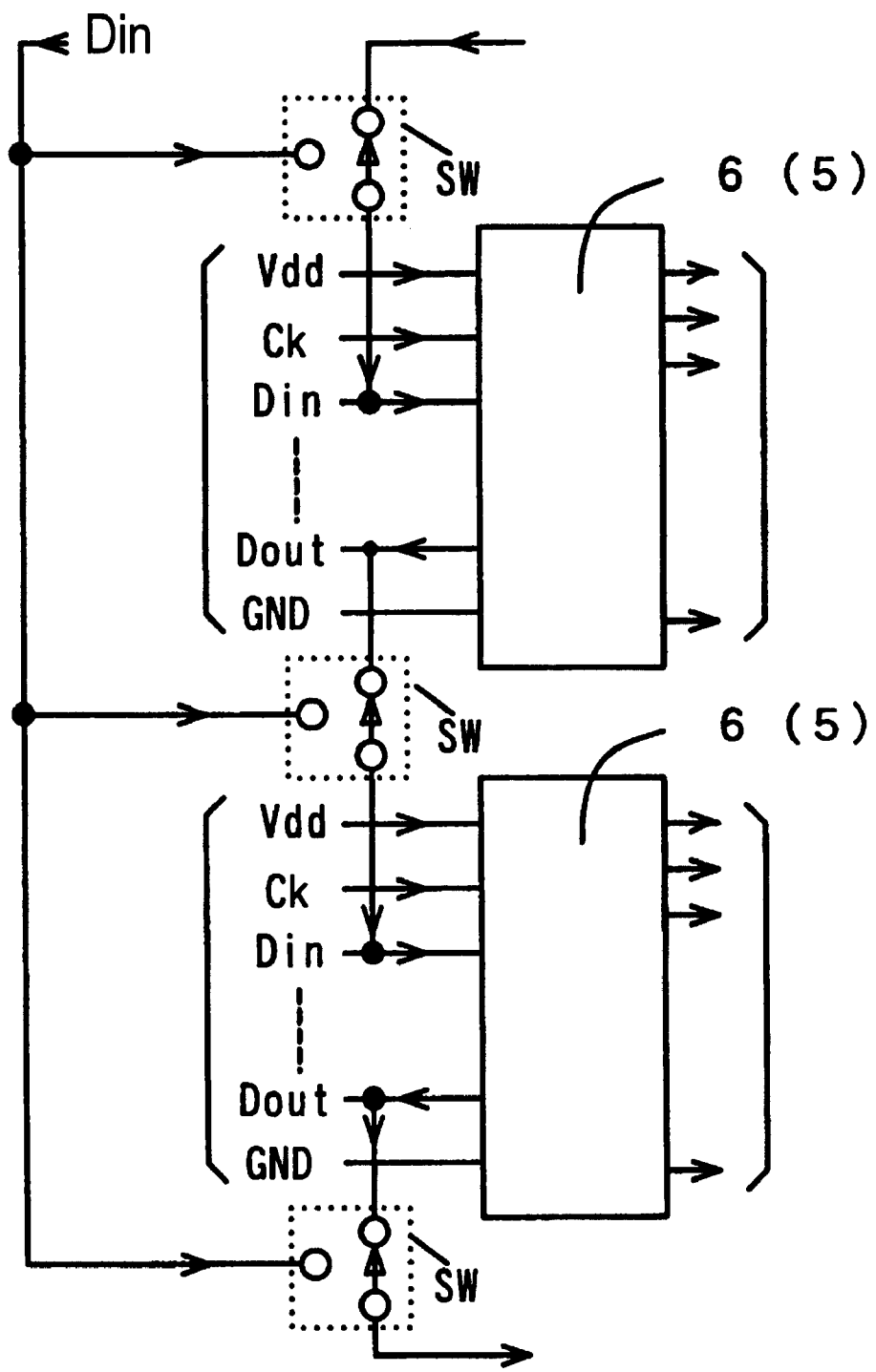
FIG. 12 is a diagram illustrating a switching between a cascade operation and single operation of the driving LSI.

In FIG. 12, Reference symbol Vdd denotes a source voltage, reference symbol Ck denotes a clock signal, and reference symbol GND denotes a grounding, which included in control signals. Signals Din and Dout are identical to those shown in FIG. 8 and will not be explained. Switches SW switch between a cascade connection and single connection of the driving LSIs. The single connection means that each driving LSI receives a shift data. An operation of the driving LSIs under the cascade connection is called a cascade operation, and that under the single connection is called a single operation.

Under the cascade connection, when the signal Dout is not released due to a fault or an installation error at a driving LSI, driving LSIs after the defective driving LSI cannot operate. As a result, it may take a considerable length of time to specify the defective driving LSI.

In order to specify the LSI, the cascade connection is replaced by the signal connection, and then, the driving LSIs to receive the input shift data Din can be inspected separately.

An inspection circuit board including the circuit boards 12, 16 and the circuit shown in FIG. 12 allows a defective portion (especially a defective driving LSI or film jumper board) to be specified readily and accurately through operating the switches SW.

Figure 13:
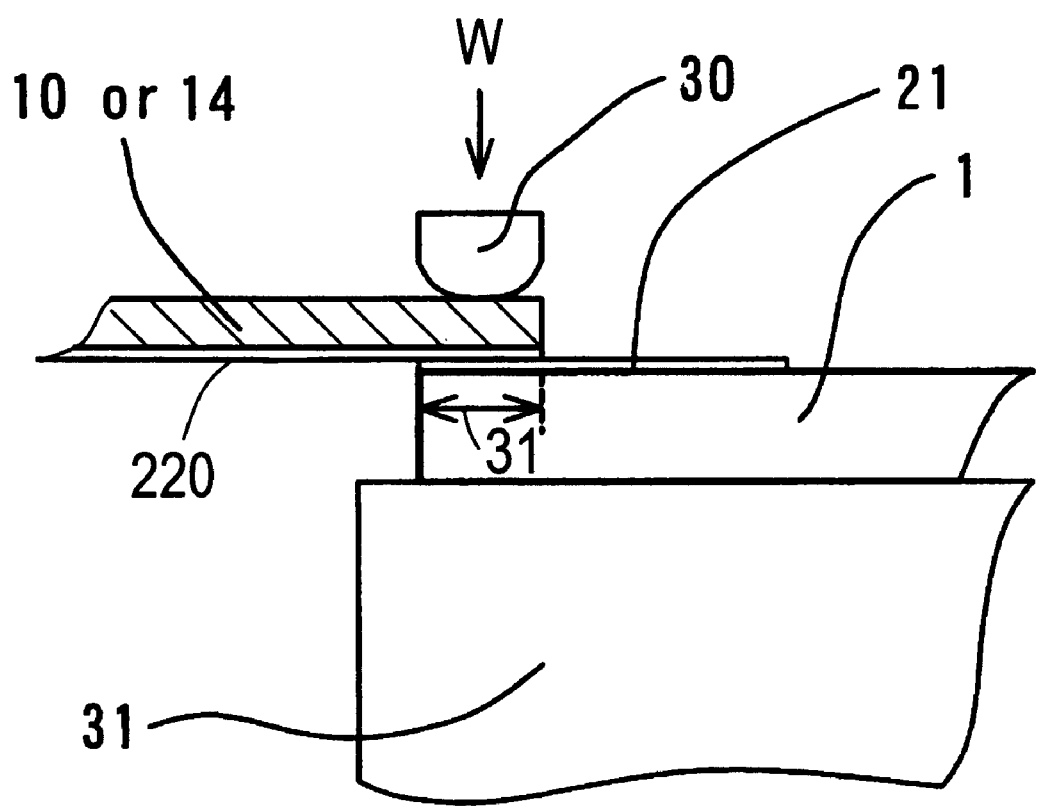
FIG. 13 is an explanatory view of joining the film jumper board and the liquid crystal panel by a pressure.

FIG. 12 shows an example of the inspection method. FIG. 13 illustrates an alternative method. In a method shown in FIG. 13, the jumper boards FY, FX is aligned with the terminal conductors 21 of the liquid crystal panel 1 accurately, a pressure W is applied with a uniformly-pressing jig 30, and jumper boards FY, FX and the terminal conductors conduct for a predetermined time. An arrow 31 denotes a region to which the pressure is applied. A connection established by the pressure applied to the film jumper boards and the terminal conductors is called a pressure connection.

The predetermined time described above is a duration required for inspecting the liquid crystal display and may usually be a few minutes. For an aging inspection inspecting an initial fault, the pressure may be applied for 24 to 48 hours.

The uniformly-pressing jig 30 for applying the pressure uniformly to the terminal conductors and the connector ports to ensure the electrical conduction includes a strip made of elastic material. Reference numeral 31 denotes an inspection table.

For an inspection where the pressure is applied to the film jumper boards and the terminal conductors to conduct, the connector ports at one end of the film jumper boards are coupled to the circuit board 12 or 15 by a connector or soldering. The inspecting method of this embodiment allows the driving LSIs and liquid crystal panel to be inspected before the film jumper boards are joined to the liquid crystal panel by thermocompression-bonding, and therefore, allows the defective portion to be specified early.

Alternatively, the film jumper boards and the circuit boards may be inspected under the pressure connection after the film jumper boards are connected to the liquid crystal panel 1 by thermocompression-bonding (not shown). In this case, the liquid crystal panel, driving LSIs, and film jumper boards can be inspected simultaneously.

The film jumper boards, upon corresponding to the driving LSIs one-to-one basis as shown in FIG. 11, can be replaced efficiently.

The method of inspecting a liquid crystal display allows the display to be inspected fast and accurately, and allows the driving LSIs or the film jumper boards to be repaired or replaced.

The connectors 11 and 15 shown in FIG. 11 may be applied to the liquid crystal display shown in FIG. 1, 4, or 6. The connectors may be coupled with one or both of the jumper boards FY and FX (not shown). This allows the film jumper boards to be easily attached to and detached from the circuit boards.

In FIG. 1 and FIGS. 3 to 7, the liquid crystal panel 1 including the driving LSIs mounted thereon with the COG mounting is explained. The COG mounting is employed only for explanation, and the panel 1 may be a poly-silicon TFT panel including the driving circuits mounted on a spare area other than a display area of the liquid crystal panel 1. The liquid crystal panel is not limited to a TFT type panel including each pixel provided with a switching element, but may be a passive matrix type including no pixel switching elements.

Industrial Applicability

As set forth above, according to the present invention, for a liquid crystal panel having a various size of screen and being mounted in a various arrangement, particularly for a panel having a large screen, an affect of a pitch error can be practically negligible. The display can be designed freely, modified easily, and employ common components. The display can have a defective driving LSI or incorrectly-mounted film jumper board specified, can be inspected for a short time, and can have the defective driving LSI or film jumper board repaired or replaced. Those contribute to a loquid crystal display having a narrow frame, lower cost, and high operational reliability.

What is claimed is:

1. A liquid crystal display comprising:
   a liquid crystal panel including:
      a plurality of signal lines and a plurality of scanning lines disposed in matrix;
      signal line driving LSIs disposed at a rim of said liquid crystal panel;
      first terminal conductors disposed at said rim, each first terminal conductor being coupled to each of said signal lines through said signal line driving LSIs;
      scanning line driving LSIs disposed at said rim; and
      second terminal conductors disposed at said rim, each second terminal conductor being coupled to each of said scanning lines through said scanning line driving LSIs;
   a circuit board including connector ports for driving said first and second terminal conductors of said liquid crystal panel;
   film jumper boards connected to terminal conductors coupled to at least one of said signal line driving LSIs coupled to said first terminal conductors and said scanning line driving LSIs coupled to said second terminal conductors of the liquid crystal panel; and
   means for switching at least one of an operation of said signal line driving LSIs and an operation of said scanning line driving LSIs between a cascade operation and single operation.

2. A liquid crystal display according to claim 1, wherein said film jumper boards satisfy at least one of cases:
   (a) that a number of said signal line driving LSIs is the same as a number of said film jumper boards for coupling between said first terminal conductors and said connector ports of the circuit board, and each of said signal line driving LSIs is coupled to each of said film jumper boards, and
   (b) that a number of said scanning line driving LSIs is the same as a number of said film jumper boards for coupling between said second terminal conductors and said connector ports of said circuit board, and each of said scanning line driving LSIs is coupled to each of said film jumper boards.

3. A liquid crystal display according to claim 1, wherein at least one of said film jumper boards includes a multi-layer wire connecting a jumper wire disposed thereon.

4. A liquid crystal display according to claim 1, wherein at least one of said film jumper boards is bonded with using an anisotropically conductive adhesive by thermocompression-bonding to at least one of:
   (a) said connector ports of said circuit board, and
   (b) said first and second terminal conductors of said liquid crystal panel.

5. A liquid crystal display according to claim 1, wherein said film jumper boards satisfy at least one of cases:
   (a) that said film jumper boards are folded from a front side to a back side of said liquid crystal panel along an edge where said first terminal conductors are disposed, and
   (b) that said film jumper boards are folded from a front side to a back side of said liquid crystal panel along an edge where said second terminal conductors are disposed.

6. A liquid crystal display according to claim 1, further comprising a flexible circuit board including:
connector ports disposed at one end thereof coupled to at least one of said first and second connector conductors of said liquid crystal panel by thermocompression bonding; and
connector ports at other end thereof coupled to said connector ports of said circuit board with a connector, wherein a terminal conductor of said terminal conductors of the liquid crystal panel which is not coupled to said flexible circuit board is coupled to said connector ports of said circuit board with said film jumper boards.

7. A liquid crystal display according to claim 1,
wherein each of said flexible jumper boards includes connector ports disposed at both ends thereof,
wherein a center line between two outermost connector ports of said connector ports at one end of each of said film jumper boards is aligned with a center line between two outermost connector ports of said connector ports disposed at other end of each said film jumper boards, and
wherein said connector ports at both ends of each of said film jumper boards are disposed symmetrically about the center lines.

8. A liquid crystal display according to claim 1, wherein each of said flexible jumper boards includes a plurality of control signal lines and a dummy line.

9. A liquid crystal display according to claim 1, wherein at least one of said first and second terminal conductors of said liquid crystal panel are disposed symmetrically about a center line between a first and last terminal connectors of said first terminal conductors.

10. A liquid crystal display according to claim 9, wherein said circuit board further includes connector ports for connecting and positioning said film jumper board symmetrically about the center line of said first terminal conductors of said liquid crystal panel.

11. A liquid crystal display according to claim 1, wherein at least one of said signal line driving LSIs and scanning line driving LSIs includes a plurality of driving LSIs, each driving LSI being coupled to each of said film jumper boards.

12. A liquid crystal display according to claim 1, wherein the at least one of the film jumper boards is mounted to the circuit board with a connector.

13. A method of inspecting a liquid crystal display which includes:
a liquid crystal panel including:
signal lines and scanning lines dispose in matrix;
signal line driving LSIs disposed at a rim of the liquid crystal panel;
first terminal conductors disposed at the rim, the first terminal conductors being coupled to the signal lines through the signal line driving LSIs;
scanning line driving LSIs disposed at the rim; and
second terminal conductors disposed at the rim, the second terminal conductors being coupled to the scanning lines through the scanning line driving LSIs;
a circuit board including connector ports for driving the first and second terminal conductors of the liquid crystal panel; and
film jumper boards each including:
a plurality of control signal lines; and
connector ports disposed at both ends of the control signal lines, the connector ports at one end of each of the control signal lines connected to one of: (1) the terminal conductors of at least one of the signal line driving LSIs coupled to the first terminal conductors of the liquid crystal panel and the scanning line driving LSIs coupled to the second terminal conductors of the liquid crystal panel; and (2) the connector ports of the circuit board, said method comprising at least one of the steps of:

(a) conducting the connector ports at other end of the film jumper boards, with a connector, to (i) the connector ports of the circuit board or (ii) the terminal conductors coupled to the driving LSIs for inspection; and (b) coupling and conducting the connector ports at the other end of the film jumper boards, by applying a pressure, to (i) the connector ports of the circuit board or (ii) the terminal conductors coupled to the driving LSIs for inspection,
wherein at least one of an operation of the signal line driving LSIs and an operation of the scanning line driving LSIs is switched between a cascade operation and single operation.

* * * * *